United States Patent [19]

Barna

[11] Patent Number: 6,160,421
[45] Date of Patent: Dec. 12, 2000

[54] VOLTAGE TRANSLATOR CIRCUIT WHICH ALLOWS FOR VARIABLE LOW VOLTAGE SIGNAL TRANSLATION

[75] Inventor: Paul Barna, Tempe, Ariz.

[73] Assignee: Microchip Technology, Incorporated, Chandler, Ariz.

[21] Appl. No.: 09/177,462

[22] Filed: Oct. 22, 1998

[51] Int. Cl.[7] ............ H03K 19/00; H03K 19/0175
[52] U.S. Cl. .................. 326/63; 326/63; 326/56; 326/86; 326/90
[58] Field of Search ................. 326/63, 80, 82, 326/56, 86, 90, 37, 62, 57, 58

[56] References Cited

U.S. PATENT DOCUMENTS

| | | | |
|---|---|---|---|
| 5,489,858 | 2/1996 | Pierce et al. | 326/56 |
| 5,581,201 | 12/1996 | Sonner et al. | 326/56 |
| 5,598,110 | 1/1997 | Chang | 326/60 |
| 5,608,341 | 3/1997 | Andersson | 326/38 |

Primary Examiner—Michael Tokar
Assistant Examiner—Vibol Tan
Attorney, Agent, or Firm—Baker Botts L.L.P.

[57] ABSTRACT

A variable low voltage signal translator uses a driver for outputting a low voltage signal translation. A control circuit is coupled to the driver for enabling and disabling the driver wherein the control circuit has an input coupled to the signal to be translated. One terminal of the pull-up resistor is coupled to an output of the driver. A second terminal of the pull-up resistor is coupled to a voltage supply which provides the low voltage level of the variable low voltage signal translator.

13 Claims, 1 Drawing Sheet

VOLTAGE TRANSLATOR CIRCUIT

VOLTAGE TRANSLATOR CIRCUIT ance translation of a data signal. In the preferred embodiment of the present invention, the

VOLTAGE TRANSLATOR CIRCUIT WHICH ALLOWS FOR VARIABLE LOW VOLTAGE SIGNAL TRANSLATION

BACKGROUND OF THE INVENTION

1. Field of the Invention

This invention relates generally to a voltage translator circuit and, more specifically, to a voltage translator circuit which uses a tri-state buffer as an open collector driver to achieve high speed variable low voltage signal translation.

2. Description of the Prior Art

Presently, low voltage signal translation of a data bus uses a standard buffer device. The buffer is used to translate the data bits on the data bus from a high voltage of approximately 5 volts to a low voltage of approximately 3.3 volts. While present voltage translator circuits do work, the voltage on the low voltage side of the translator is always fixed, or at best, voltage limited.

Therefore, a need existed to provide an improved voltage translator circuit. The improved voltage translator circuit must allow for a variable voltage on the low voltage side of the improved voltage translator circuit. The improved voltage translator circuit must further allow for lower voltage levels to be achieved on the low voltage side of the voltage translator circuit than is currently available with standard buffer devices. The improved voltage translator circuit must also operate at a speed comparable to present circuits.

SUMMARY OF THE INVENTION

In accordance with one embodiment of the present invention, it is an object of this invention to provide an improved voltage translator circuit.

It is another object of the present invention to provide an improved voltage translator circuit that allows for a variable voltage on the low voltage side of the improved voltage translator circuit.

It is still another object of the present invention to provide an improved voltage translator circuit that allows for lower voltage levels to be achieved on the low voltage side of the voltage translator circuit.

It is yet another object of the present invention to provide an improved voltage translator circuit that maintains comparable speed to present voltage limited or fixed voltage circuits.

BRIEF DESCRIPTION OF THE PREFERRED EMBODIMENTS

In accordance with one embodiment of the present invention, a variable low voltage signal translator is disclosed. The variable low voltage signal translator has a driver circuit. A control circuit is coupled to the driver circuit and is used for enabling and disabling the driver. The control circuit has at least one input coupled to a signal that the signal translator is to translate. A resistor has one terminal coupled to an output of the driver circuit and a second terminal coupled to a voltage supply. The voltage supply is used to supply the low voltage level of the variable low voltage signal translator.

In accordance with one embodiment of the present invention, a variable low voltage signal translator for a data bus is disclosed. The variable low voltage signal translator for a data bus uses a driver for outputting a low voltage signal translation of data on said data bus. A control circuit is coupled to the driver for enabling and disabling the driver. The control circuit has at least one input which is coupled to the data bus to be translated. A resistor has a first terminal coupled to an output of the driver and a second terminal coupled to a voltage supply. The voltage supply is used to supply the low voltage level of the variable low voltage signal translator.

The foregoing and other objects, features, and advantages of the invention will be apparent from the following, more particular, description of the preferred embodiments of the invention, as illustrated in the accompanying drawing.

DETAILED DESCRIPTION OF THE PREFERRED EMBODIMENTS

Figure 1:
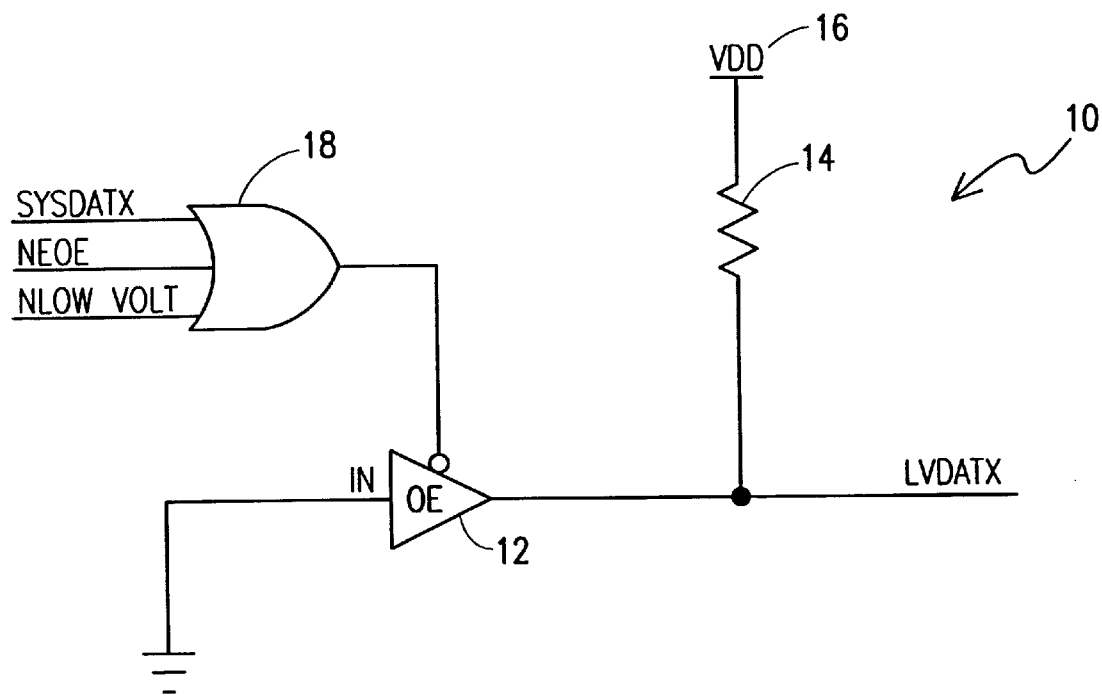
FIG. 1 is a simplified functional block diagram of the voltage translator circuit of the present invention.

Referring to FIG. 1, a voltage translator circuit 10 (hereinafter circuit 10) is shown. The circuit 10 is used to provide a variable low voltage translation of a data signal. In the preferred embodiment of the present invention, the circuit 10 is used for low voltage emulation of a system processor address and data busses.

The circuit 10 uses an output driver 12. In the preferred embodiment of the present invention, the output driver 12 is a tri-state output driver which is used as an open collector driver to provide an active low drive capability. The input of the output driver 12 is coupled to ground. The output of the output driver 12 is coupled to a first terminal of a pull-up resistor 14. The second terminal of the pull-up resistor 14 is coupled to a voltage supply $V_{DD}$ 16. The voltage supply $V_{DD}$ 16 provides a voltage equal to the low level voltage conversion that is desired.

The output enable (OE) of the output driver 12 is coupled to a control circuit 18. The control circuit 18 is used to enable and disable the output driver 12. In the embodiment depicted in FIG. 1, the control circuit 18 is an OR gate. The control circuit 18 will have one or more inputs which are used to enable and disable the output driver 12. In the embodiment depicted in FIG. 1, the control circuit 18 has a first input which is coupled to the data signal which is to be translated. In the preferred embodiment of the present invention, the first input (SYSDATx) of the control circuit 18 is coupled to a data bit of the bus to be translated. The second input (NEOE) of the control circuit 18 is coupled to an output enable signal line of the data bus. In the preferred embodiment of the present invention, the second input (NEOE) is an active low signal which is used to signal when data may be transferred onto the data bus. The control circuit 18 may further have a third input (NLOW-VOLT). The third input (NLOW_VOLT) is used as a master enable to activate or deactivate the output driver 12. In the preferred embodiment of the present invention, the third input (NLOW-VOLT) is an active low input signal.

OPERATION

The low voltage side high level is accomplished by the pull-up resistor 14 and the voltage supply 16. The output driver 12 will either drive the data bit low during a program memory fetch or remain tri-stated to provide a high level via the pull-up resistor 14.

Since the input of the output driver 12 is grounded, once the output enable (OE) of the output driver 12 is driven low to enable, the output of the output driver 12 will output low if the first input (SYSDATx) is low. Conversely, if the output enable (OE) of the output driver 12 is driven high, the output buffer 12 is tri-stated and the pull-resistor 14 pulls the output of the output driver 12 to the desired translated voltage level (i.e., the voltage level of the voltage supply $V_{DD}$ 16).

In the embodiment shown in FIG. 1, the output enable (OE) of the output driver 12 is controlled by three signals. The signal NLOW-VOLT serves as a master enable to activate or deactivate the output driver 12. If NLOW-VOLT is high, the output driver 12 will be disabled. If NLOW-VOLT is low, the combination of the other two signals SYSDATx and NEOE will determine the output of the output buffer 12.

The voltage translator circuit 10 addresses the biggest drawback for many voltage translator circuits, namely a lack of speed. Because of the default state of the output is a high level via the pull-up resistor 14, there is essentially no delay for a data bit that is high since the output is already at this state when NEOE is asserted low, and only a small delay for the output driving low.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A variable low voltage signal translator comprising, in combination:
   a driver;
   a control circuit coupled to said driver for enabling and disabling said driver wherein said control circuit has a first input coupled to a first signal that said signal translator is to translate, a second input coupled to a second signal which enables and disables said driver, and a third input coupled to a third signal which indicates when data is to be driven on the first signal:
   a resistor coupled to an output of said driver; and
   a voltage supply coupled to said resistor.

2. A variable low voltage signal translator in accordance with claim 1 wherein an input of said driver is grounded.

3. A variable low voltage signal translator in accordance with claim 1 wherein said driver is a tri-stateable buffer.

4. A variable low voltage signal translator in accordance with claim 1 wherein said control circuit is a logic gate.

5. A variable low voltage signal translator in accordance with claim 4 wherein said logic gate is an OR gate.

6. A variable low voltage signal translator in accordance with claim 1 wherein said voltage supply supplies a low voltage level of said variable low voltage signal translator.

7. A variable low voltage signal translator for a data bus comprising, in combination:
   a driver for outputting a low voltage signal translation of data on a data bus;
   a control circuit coupled to said driver for enabling and disabling said driver wherein said control circuit has a first input coupled to said data bus, and a second input coupled to a processor signal which indicates when said data is to be driven on said data bus, and a third input coupled to a third signal which enables and disables said driver;
   a resistor coupled to an output of said driver; and
   a voltage supply coupled to said resistor.

8. A variable low voltage signal translator in accordance with claim 7 wherein an input of said driver is grounded.

9. A variable low voltage signal translator in accordance with claim 7 wherein said driver is a tri-stateable buffer.

10. A variable low voltage signal translator in accordance with claim 7 wherein said control circuit is a logic gate.

11. A variable low voltage signal translator in accordance with claim 10 wherein said logic gate is an OR gate.

12. A variable low voltage signal translator in accordance with claim 7 wherein said voltage supply supplies a low voltage level of said variable low voltage signal translator.

13. A variable low voltage signal translator for a data bus comprising, in combination:
   a driver for outputting a low voltage signal translation of said data bus wherein an input of said driver is grounded wherein said driver is a tri-stateable buffer;
   a control circuit coupled to said driver for enabling and disabling said driver wherein said control circuit has an input coupled to said data bus wherein said logic gate is an OR gate having a first input coupled to said data bus, a second input coupled to a processor signal which indicates when data is to be driven on said data bus, and a third input coupled to a third signal which enables and disables said driver;
   a resistor coupled to an output of said driver; and
   a voltage supply coupled to said resistor wherein said voltage supply supplies a low voltage level of said variable low voltage signal translator.

* * * * *